Figure 1:
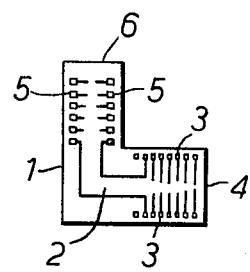

United States Patent [19]

Cooper et al.

[11] 4,219,882
[45] Aug. 26, 1980

[54] MAGNETIC DOMAIN DEVICES

[75] Inventors: Paul V. Cooper, Kingsley; Anthony Marsh, Blisworth, both of England

[73] Assignee: Plessey Handel und Investments AG., Zug, Switzerland

[21] Appl. No.: 972,361

[22] Filed: Dec. 22, 1978

[30] Foreign Application Priority Data

Dec. 29, 1977 [GB] United Kingdom ............... 54080/77

[51] Int. Cl.² ........................ G11C 19/08; G11C 5/04
[52] U.S. Cl. ........................................... 365/2; 365/53
[58] Field of Search ....................................... 365/2, 53

[56] References Cited

U.S. PATENT DOCUMENTS 3,983,547  9/1976  Almasi ..................................... 365/2
3,996,574  12/1976  Bobeck et al. ........................... 365/2

Primary Examiner—James W. Moffitt
Attorney, Agent, or Firm—Fleit & Jacobson

[57] ABSTRACT

A magnetic domain device has a pair of orthogonally disposed coils one inside the other with the device chip disposed in the center of both of the coils, and a flexible substrate to which the device chip is directly or indirectly attached, the flexible substrate being suitably shaped and folded so that it extends between the coils and enables external electrical connection to be made to the device chip.

7 Claims, 2 Drawing Figures

U.S. Patent     Aug. 26, 1980     4,219,882

MAGNETIC DOMAIN DEVICES

This invention relates to magnetic domain devices commonly referred to as bubble memory devices.

In bubble memory devices, it is necessary to provide an in-field rotating magnetic field in the vicinity of the device chip and this field is usually provided by a pair of orthogonally disposed coils, one of which fits inside the other, with the device chip disposed in the centre of both coils. In such an arrangement, it is necessary, in order to make electrical connection to the device chip, to make one or both of the coils larger than would otherwise be necessary, in order to bring out interconnecting leads.

According to the present invention, there is provided a magnetic domain device having a pair of orthogonally disposed coils, one inside the other, with a device chip disposed in the centre of both of the coils, and flexible substrate means to which the device chip is directly or indirectly attached, the flexible substrate means being suitably shaped and folded so that it extends between said coils and enables external electrical connection to be made to the device chip.

In carrying out the invention, the flexible substrate means may take the form of a printed circuit board e.g. of 'Kapton', of 'L' or other suitable shape, the flexible substrate means being provided with an electrical conductor pattern to which the device chip is directly or indirectly electrically connected and to which, when the flexible substrate means is folded back between said two coils and over the outer one of said two coils, a lead frame is electrically connected.

The flexible substrate means may be of single sided form, or may be of double-sided or multi-layer form to enable one or both sides of the electrical conductor pattern to be screened.

Figure 2:
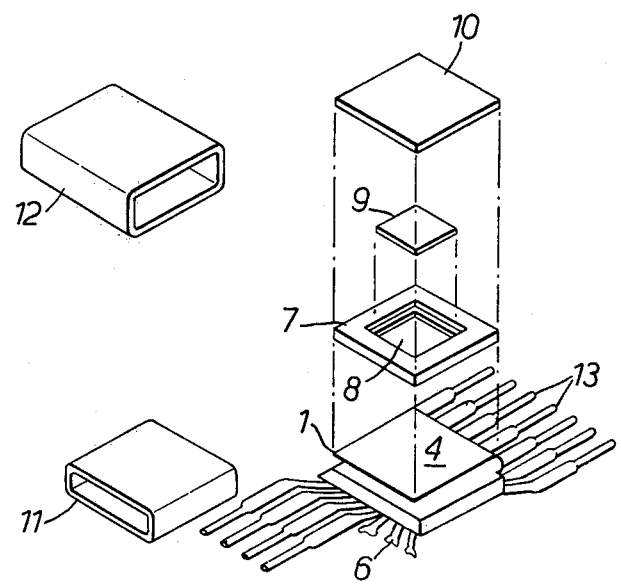

An exemplary embodiment of the invention will now be described, reference being make to the accompanying drawing, in which:

FIG. 1 depicts a flexible substrate for use in a bubble memory device in accordance with the present invention; and FIG. 2 is an exploded view of part of the bubble memory device according to the present invention, illustrating how the flexible substrate of FIG. 1 is embodied in such a device.

In accordance with the present invention, electrical interconnection between a bubble memory device chip and a device lead frame is effected by means of a flexible printed circuit board substrate, one form of which is depicted in FIG. 1 of the drawing. The flexible substrate 1 shown in FIG. 1 is of generally 'L' shaped form which is provided with a printed circuit conductor pattern 2 which consists of a series of conductors which extend from one set of termination pads 3 on one limb 4 of the substrate to another set of termination pads 5 of the other limb 6 of the substrate. The sets of termination pads 3 and 5 are used for making electrical connection to the device chip and lead frame assembly, respectively, as will be described with reference to FIG. 2 of the drawings.

FIG. 2 depicts a chip carrier 7 having a central recess 8 for containing a chip 9 and a chip cover 10 which is attachable to the chip carrier 7 so as to hermetically enclose the chip 9. The chip carrier 7 is provided with a plurality of electrical conductors (not shown) which extend from inside the cavity 8 to its underside (as viewed), the device chip 9 being electrically connected by means of individual wires (not shown) to the conductors inside the cavity 8. The chip carrier 7 is then attached to the limb 4 of the flexible substrate 1 so that the electrical conductors on the underside if the chip carrier 7 contact the termination pads 3 (FIG. 1), and an 'X' coil 11 is slipped over the chip carrier 7. The remaining part of the flexible substrate 1 is then folded back on itself over the outside of the 'X' coil 11 to enable a 'Y' coil 12 to be slipped over the chip carrier 7 and the 'X' coil 11, the direction of assembly of the 'Y' coil being orthogonal to the direction of assembly of the 'X' coil 11. The free part of the flexible substrate 1, consisting of the limb 6, is then folded back on itself over the outside of the 'Y' coil 12, and is then bonded to a lead frame assembly 13 which makes contact with the termination pads 5 on the limb 6. In this way, electrical connection is made between the chip 9 and the lead frame 13 without necessitating enlarged 'X' and 'Y' coils.

The flexible substrate may be provided in any suitable material e.g. (Kapton), and may be of any suitable shape e.g. ('T' shaped) dependent upon the particular application. It may be arranged that the flexible substrate be of double sided form, with a continuous conductor on one side of a flexible substrate affording screening for a conductor pattern carried by the other side. It is also anticipated that the substrate may be of multi-layer form so that both sides of a conductor pattern may be screened.

It should be appreciated that the assembly procedure described with reference to FIG. 2 has been given by way of example only and, rather than the chip carrier 7 and lead frame 13 being bonded to the flexible substrate 1 in the sequence described, they may both be attached to the flexible substrate before assembly of the 'X' and 'Y' coils 11 and 12, respectively.

It is also envisaged that, as well as encapsulating the chip 9 in the chip carrier 7, the chip carrier 7 then being attached to the flexible substrate 1, in some applications it may be sufficient and desirable to attach the chip 9 directly to the flexible substrate 1 without any intermediate chip carrier. In such an arrangement, the chip 9 may be bonded to the flexible substrate 1 using conventional flip-chip bonding techniques, and may result in reduced package dimensions.

It is obvious that the embodiments of the present invention described hereinabove are merely illustrative and that other modifications and adaptations thereof may be made without departing from the scope of the appended claims.

What we claim is:

1. A magnetic domain device having a pair of orthogonally disposed coils one inside the other with a device chip disposed in the centre of both of the coils and flexible substrate means to which the device chip is directly or indirectly attached, the flexible substrate means being suitably shaped and folded so that it extends between said coils and enables external electrical connection to be made to the device chip.

2. A magnetic domain device as claimed in claim 1 in which the flexible substrate means takes the form of a printed circuit board provided with an electrical conductor pattern to which the device chip is directly or indirectly electrically connected and to which when the flexible substate means is folded back between the said two coils and over the outer one of said two coils a lead frame is electrically connected.

3. A magnetic domain device as claimed in claim 2 in which the printed circuit board is of 'L' shape.

4. A magnetic domain device as claimed in claim 2 or 3 in which the printed circuit board is formed form 'Kapton'.

5. A magnetic domain device as claimed in claim 4 in which the printed circuit board is of single sided, or double sided, or multi-layer form to enable one or both sides of the electrical conductor pattern to be screened.

6. A magnetic domain device as claimed in claim 3 in which the printed circuit board is of single sided, or double sided, or multi-layer form to enable one or both sides of the electrical conductor pattern to be screened.

7. A magnetic domain device as claimed in claim 2 in which the printed circuit board is of single sided, or double sided, or multi-layer form to enable one or both sides of the electrical conductor pattern to be screened.

* * * * *